(12) United States Patent
Aizenberg et al.

(10) Patent No.: US 8,721,161 B2
(45) Date of Patent: May 13, 2014

(54) FLUID OSCILLATIONS ON STRUCTURED SURFACES

(75) Inventors: Joanna Aizenberg, New Providence, NJ (US); Marc Scott Hodes, New Providence, NJ (US); Paul Robert Kolodner, Hoboken, NJ (US); Thomas Nikita Krupenkin, Warren, NJ (US); Joseph Ashley Taylor, Springfield, NJ (US)

(73) Assignee: Alcatel Lucent, Paris (FR)

( * ) Notice: Subject to any disclaimer, the term of this patent is extended or adjusted under 35 U.S.C. 154(b) by 2478 days.

(21) Appl. No.: 11/227,759

(22) Filed: Sep. 15, 2005

(65) Prior Publication Data

US 2007/0058483 A1   Mar. 15, 2007

(51) Int. Cl.
*B01F 11/02* (2006.01)

(52) U.S. Cl.
USPC .......................................... 366/127

(58) Field of Classification Search
USPC .......... 366/127; 200/200, 201, 208, 233, 234, 200/235; 204/450, 547, 667
See application file for complete search history.

(56) References Cited

U.S. PATENT DOCUMENTS

| | | | |
|---|---|---|---|
| 3,268,320 A * | 8/1966 | Penberthy ........................ 65/178 |
| 3,454,686 A | 7/1969 | Jones |
| 3,670,130 A | 6/1972 | Greenwood |
| 4,030,813 A | 6/1977 | Kohashi et al. |
| 4,118,270 A | 10/1978 | Pan et al. |
| 4,137,060 A | 1/1979 | Timmermann |
| 4,338,352 A | 7/1982 | Bear et al. |
| 4,341,310 A | 7/1982 | Sangiovanni et al. |
| 4,390,403 A * | 6/1983 | Batchelder .................... 204/547 |
| 4,406,732 A | 9/1983 | Kayoun |
| 4,569,575 A | 2/1986 | Le Pesant et al. |
| 4,583,824 A * | 4/1986 | Lea ........................... 359/223.1 |
| 4,653,847 A | 3/1987 | Berg et al. |
| 4,671,609 A | 6/1987 | Khoe et al. |
| 4,708,426 A | 11/1987 | Khoe et al. |
| 4,783,155 A | 11/1988 | Imataki et al. |
| 4,784,479 A | 11/1988 | Ikemori |
| 4,867,521 A | 9/1989 | Mallinson |
| 4,948,214 A | 8/1990 | Hamblen |

(Continued)

FOREIGN PATENT DOCUMENTS

| | | |
|---|---|---|
| DE | 19623270 A | 1/1998 |
| DE | 197 05 910 | 6/1998 |

(Continued)

OTHER PUBLICATIONS

Nanotech makes liquids manageable. Energy Optimization News, May 1, 2004.*

(Continued)

*Primary Examiner* — Charles E Cooley
(74) *Attorney, Agent, or Firm* — Hitt Gaines, PC

(57) ABSTRACT

A device comprising a substrate having a surface that comprises a conductive base layer. The device also comprises fluid-support-structures on the conductive base layer. Each of the fluid-support-structures has at least one dimension of about 1 millimeter or less. Each of the fluid-support-structures is coated with an electrical insulator. The device is configured to oscillate a fluid locatable between tops of the fluid-support-structures and the conductive base layer when a voltage is applied between the conductive base layer and the fluid.

9 Claims, 14 Drawing Sheets

(56) References Cited

U.S. PATENT DOCUMENTS

| | | | |
|---|---|---|---|
| 5,248,734 A | | 9/1993 | Ober et al. |
| 5,348,687 A | | 9/1994 | Beck et al. |
| 5,412,746 A | | 5/1995 | Rossberg et al. |
| 5,427,663 A | * | 6/1995 | Austin et al. ............... 204/549 |
| 5,428,711 A | | 6/1995 | Akiyama et al. |
| 5,486,337 A | | 1/1996 | Ohkawa |
| 5,518,863 A | | 5/1996 | Pawluczyk |
| 5,659,330 A | * | 8/1997 | Sheridon .................. 345/84 |
| 5,665,527 A | | 9/1997 | Allen et al. |
| 5,716,842 A | | 2/1998 | Baier et al. |
| 5,731,792 A | * | 3/1998 | Sheridon .................. 345/84 |
| 5,922,299 A | | 7/1999 | Bruinsma et al. |
| 5,948,470 A | | 9/1999 | Harrison et al. |
| 6,014,259 A | | 1/2000 | Wohlstadter |
| 6,027,666 A | | 2/2000 | Ozin et al. |
| 6,185,961 B1 | | 2/2001 | Tonucci et al. |
| 6,200,013 B1 | | 3/2001 | Takeuchi et al. |
| 6,232,129 B1 | | 5/2001 | Wiktor |
| 6,284,546 B1 | | 9/2001 | Bryning et al. |
| 6,294,137 B1 | * | 9/2001 | McLaine ................ 422/186.04 |
| 6,319,427 B1 | | 11/2001 | Ozin et al. |
| 6,329,070 B1 | | 12/2001 | Sass et al. |
| 6,369,954 B1 | | 4/2002 | Berge et al. |
| 6,379,874 B1 | | 4/2002 | Ober et al. |
| 6,387,453 B1 | | 5/2002 | Brinker et al. |
| 6,409,907 B1 | | 6/2002 | Braun et al. |
| 6,465,387 B1 | | 10/2002 | Pinnavaia et al. |
| 6,471,761 B2 | | 10/2002 | Fan et al. |
| 6,473,543 B2 | | 10/2002 | Bartels |
| 6,538,823 B2 | | 3/2003 | Kroupenkine et al. |
| 6,545,815 B2 | | 4/2003 | Kroupenkine et al. |
| 6,545,816 B1 | | 4/2003 | Kroupenkine et al. |
| 6,790,330 B2 | * | 9/2004 | Gascoyne et al. ............ 204/547 |
| 6,891,682 B2 | | 5/2005 | Aizenberg et al. |
| 7,172,736 B2 | | 2/2007 | Kawamura et al. |
| 7,204,298 B2 | * | 4/2007 | Hodes et al. ................ 165/80.4 |
| 7,211,223 B2 | | 5/2007 | Fouillet et al. |
| 7,255,780 B2 | * | 8/2007 | Shenderov .................. 204/450 |
| 7,507,433 B2 | | 3/2009 | Weber |
| 7,611,614 B2 | | 11/2009 | Reel et al. |
| 7,767,069 B2 | | 8/2010 | Lee et al. |
| 7,780,830 B2 | | 8/2010 | Haluzak et al. |
| 7,875,160 B2 | | 1/2011 | Jary |
| 8,529,774 B2 | * | 9/2013 | Krupenkin et al. |
| 2001/0036669 A1 | * | 11/2001 | Jedrzejewski et al. ........ 436/94 |
| 2002/0125192 A1 | | 9/2002 | Lopez et al. |
| 2003/0020915 A1 | | 1/2003 | Schueller et al. |
| 2003/0038032 A1 | * | 2/2003 | Reel et al. .................. 204/643 |
| 2003/0148401 A1 | | 8/2003 | Agrawal et al. |
| 2003/0183525 A1 | * | 10/2003 | Elrod et al. .................. 204/547 |
| 2003/0227100 A1 | | 12/2003 | Chandross et al. |
| 2004/0018129 A1 | | 1/2004 | Kawamura et al. |
| 2004/0031688 A1 | * | 2/2004 | Shenderov .................. 204/600 |
| 2004/0055891 A1 | * | 3/2004 | Pamula et al. .................. 205/98 |
| 2004/0058450 A1 | * | 3/2004 | Pamula et al. ................ 436/150 |
| 2004/0136876 A1 | * | 7/2004 | Fouillet et al. ................ 422/100 |
| 2004/0191127 A1 | * | 9/2004 | Kornblit et al. ............... 422/100 |
| 2004/0210213 A1 | * | 10/2004 | Fuimaono et al. .............. 606/41 |
| 2004/0211659 A1 | * | 10/2004 | Velev ............................ 204/164 |
| 2005/0039661 A1 | | 2/2005 | Kornblit et al. |
| 2005/0069458 A1 | | 3/2005 | Hodes et al. |
| 2005/0115836 A1 | * | 6/2005 | Reihs ............................ 204/450 |
| 2006/0108224 A1 | * | 5/2006 | King et al. .................... 204/450 |
| 2006/0172189 A1 | * | 8/2006 | Kolodner et al. ............. 429/129 |
| 2007/0048858 A1 | * | 3/2007 | Aizenberg et al. ......... 435/287.2 |
| 2007/0056853 A1 | * | 3/2007 | Aizenberg et al. ............ 204/547 |
| 2007/0058483 A1 | | 3/2007 | Aizenberg et al. |
| 2007/0059213 A1 | * | 3/2007 | Aizenberg et al. .............. 422/99 |
| 2007/0059489 A1 | * | 3/2007 | Hodes et al. .................. 428/141 |
| 2007/0237025 A1 | * | 10/2007 | Krupenkin et al. ............ 366/127 |
| 2007/0272528 A1 | * | 11/2007 | Gasparyan et al. ........... 200/181 |
| 2008/0137213 A1 | | 6/2008 | Kuiper et al. |
| 2009/0260988 A1 | | 10/2009 | Pamula et al. |
| 2010/0110532 A1 | | 5/2010 | Takemoto et al. |
| 2010/0116656 A1 | | 5/2010 | Garcia Tello et al. |

FOREIGN PATENT DOCUMENTS

| | | |
|---|---|---|
| DE | 197 04 207 A1 | 8/1998 |
| EP | 0 290 125 | 11/1988 |
| EP | 1120164 | 8/2001 |
| FR | 2769375 | 4/1999 |
| WO | WO 99/18456 | 4/1999 |
| WO | WO 99/54730 | 10/1999 |
| WO | WO 01/31404 A1 | 5/2001 |
| WO | WO 01/42540 | 6/2001 |
| WO | WO 01/51990 | 7/2001 |
| WO | WO 03/056330 | 7/2003 |
| WO | WO 03/071335 | 8/2003 |
| WO | WO 03/083447 | 10/2003 |
| WO | WO 03/103835 | 12/2003 |

OTHER PUBLICATIONS

Tunable surfaces. Physics News 678 (American Institute of Physics), Mar. 26, 2004.*
Super-repellent surface switches on and off. P Weiss, Science News, Apr. 24, 2004.*
Bell Labs invention could mean cooler chips. A Gonsalves, Techweb Network, Mar. 12, 2004.*
'Nanograss' turns sticky to slippery in an instant. K Chang, New York Times, Mar. 16, 2004.*
Krupenkin et al. Tunable liquid microlens. Applied Physics Letters 82 (2003) 316-318.*
Pamula et al. Cooling of integrated circuits using droplet-based microfluidics. Proceedings of the 13th ACM Great Lakes symposium on VLSI, Washington DC, Apr. 28-29, 2003. Proceedings pp. 84-87.*
Oprins et al. On-chip liquid cooling with integrated pump technology. Proceedings of the 21st IEEE Semi-Therm Symposium, San Jose, CA, Mar. 15-16, 2005.*
Krupenkin et al 2005. Electrically tunable superhydrophobic nanostructured surfaces. Bell Labs Technical Journal 10(3) (2005) 161-170.*
Krupenkin et al. From rolling ball to complete wetting: the dynamic tuning of liquids on nanostructured surfaces. Langmuir 20 (2004) 3824-3827. Including Supporting Information section, published on Langmuir's website.*
Krupenkin et al. From rolling ball to complete wetting on dynamically tunable nanostructured surfaces. Abstract Y22.006. Abstracts, meeting of the American Physical Society in Montreal, Canada, Mar. 22-26, 2004.*
Bell Labs scientists discover technique to control fluids using specially fabricated silicon "nanograss". Lucent Technologies, press release Mar. 12, 2004. No longer available on Lucent's press archive, but available through the Internet Archive.*
Super-repellent surface switches on and off. P. Weiss, Science News, Apr. 24, 2004.*
'Nanograss' turns sticky to slippery in an instant. K. Chang, New York Times, Mar. 16, 2004.*
U.S. Appl. No. 10/040,017, filed Jan. 4, 2000, Megens et al.
U.S. Appl. No. 10/094,093, filed Mar. 8, 2002, Eggleton et al.
U.S. Appl. No. 10/096,199, filed Mar. 12, 2002, Chandross et al.
U.S. Appl. No. 10/098,286, filed Mar. 15, 2002, Chen et al.
U.S. Appl. No. 10/135,973, filed Apr. 30, 2002, Z Bao et al.
U.S. Appl. No. 10/139,124, filed May 3, 2002, Kroupenkine et al.
U.S. Appl. No. 10/231,614, filed Aug. 30, 2002, Kroupenkine et al.
U.S. Appl. No. 10/321,027, filed Dec. 17, 2002, Reichmanis et al.
U.S. Appl. No. 10/383,150, filed Mar. 6, 2003, Chen et al.
U.S. Appl. No. 10/402,046, filed Mar. 28, 2003, Aizenberg et al.
U.S. Appl. No. 10/403,159, Mar. 31, 2003, Kornblit et al.
U.S. Appl. No. 10/631,996, filed Jul. 31, 2003, Aizenberg et al.
U.S. Appl. No. 10/637,837, filed Aug. 8, 2003, Davis et al.
U.S. Appl. No. 10/649,285, filed Aug. 27, 3003, Kornblit et al.
U.S. Appl. No. 10/674,448, filed Sep. 30, 2003, Hodes et al.
U.S. Appl. No. 10/716,084, filed Nov. 18, 2003, Kroupenkine et al.
U.S. Appl. No. 10/798,064, filed Mar. 11, 2004, Amey et al.
U.S. Appl. No. 10/803,565, filed Mar. 18, 2004, Hodes et al.
U.S. Appl. No. 10/803,576, filed Mar. 18, 2004, Kroupenkine et al.
U.S. Appl. No. 10/803,641, filed Mar. 18, 2004, Hodes et al.
U.S. Appl. No. 10/806,543, filed Mar. 23, 2004, Amey et al.

(56) References Cited

OTHER PUBLICATIONS

U.S. Appl. No. 10/810,774, filed Mar. 26, 2004, Krouopenkine et al.
U.S. Appl. No. 10/816,569, filed Apr. 1, 2004, Gasparyan et al.
Washizu, Masao, "Electrostatic Actuation of Liquid Droplets for Microreactor Applications," IEEE Transactions on Industry Applications, vol. 34, No. 4, Jul./Aug. 1998, pp. 732-737.
Schilling, Andreas et al., Surface Profiles of Reflow Microlenses Under the Influence of Surface Tension and Gravity, Opt. Eng. (39(B) pp. 2171-2176, Society of Photo-Optical Instrumentation Engineers, Aug. 2000.
Danzerbrink, R. et al., "Deposition of Micropatterned Coating Using an Ink-Jet Technique," Thin Solid Films 351, pp. 115-118, Elsevier Science S.A. (1999).
Feng, Chuan Liang at al., "Reversible Wettabililty of Photoresponsive Flourine-Containing Azobenzene Polymer in Langmuir-Blodgett Films," Langmuir vol. 17, No. 15, 2001, pp. 4593-4597, American Chemical Society published on Web Jun. 22, 2001.
Ichimura, Kunihiro et al., "Light-Driven Motion of Liquids on a Photoresponsive Surface." Science. vol. 288. Jun. 2, 2000. pp. 1624-1626.
Commander, L.G. et al., "Variable Focal Length Microlenses," Optics Communications 177. Apr. 15, 2000. pp. 157-170.
Aizenberg, J., et al., "Calcitic microlenses as part of the photoreceptor system in brittlestars." Nature. vol. 412. pp. 819-822. Aug. 23, 2001.
English language translation of abstract for German Patent Document: DE 19623270 from European Patent Office database, esp@cenet.com, (1998), 1 page.
Tuberfield, A.J., "Photonic Crystals Made by Holographic Lithography," MRS. Bulletin. Aug. 2001. pp. 632-636.
Campbell, M., et al., "Fabrication of Photonic Crystals for the Visible Spectrum by Holographic Lithography," Nature, vol. 404, Mar. 2, 2000, pp. 53-56.
Ho, K.M., et al., "Existence of a Photonic Gap in Periodic Dielectric Structures," Physical Review Letters, vol. 65, No. 25, Dec. 17, 1990, pp. 3152-3155.
Ozbay, E., et al., "Measurement of a Three-Dimensional Photonic Band Gap in a Crystal Structure Made of Dielectric Rods," Physical Review B, vol. 50, No. 3, Jul. 15, 1994, pp. 1945-1948.
Tuberfleld, A., "Photonic Crystals Made by Holographic Lithography," Abstract from Symposium K, Microphotonics-Materials, Phyisics, and Applications, Nov. 26-29, 2001, 1 page.
Shoji, S., et al., "Photofabrication of Three-Dimensional Photonic Crystals by Multibeam Laser Interference Into a Photopolymarizable Resin," Applied Physics Letters, vol. 76, No. 19, May 8, 2000, pp. 2668-2670.
Sundararajan, N., et al., "Supercritical CO2 Processing for Submicron Imaging of Fluoropolymers," Chemistry of Materials, vol. 12, No. 1, Jan. 2000, pp. 41-48.
Kresge, C.T., et al: "Ordered mesoporous molecular sieves synthesized by a liquid-crystal template mechanism" Nature, vol. 359, Oct. 1992, pp. 710-712.
Tanev, Peter T., et al: "A Neutral Templating Route to Mesaporous Molecular Sieves." Science. vol. 267. Feb. 1995. pp. 855-867.
Huo, Q. et al: "Generalized synthesis of periodic surfactant/inorganic composite materials." Nature. vol. 368. Mar. 1994. pp. 317-321.
Sanchez, C., et al: "Design and Properties of Hybrid Organic-Inorganic Nanocomposites for Photonics." MRS Bulletin. May 2001. pp. 377-387.
Yang, P., et al: "Hierarchically Ordered Oxides," Science, vol. 282, Dec. 1998, pp. 2244-2246. Templin, M. et al: "Organically Modified Aluminosilicate Masostructures from Block Copolymer Phases," Science vol. 278 Dec. 1997 pp. 1795-1798.
Raman, N.K., et al: "Template-Based Approaches to the Preparation of Amorphous, Nanoporous Silicas," Chemical Matter, vol. 8, Feb. 1996, pp. 1682-1701.

Yang, P., et al: "Block Copolymer Templating Synthesis of Mesoporous Metal Oxides with Large Ordering Lengths and SemiCrystalline Framework," Chemical Matter, vol. 11, 1999, pp. 2813-2826.
Brinker, C.J., et al., "Evaporation-Induced Self-Assembly: Nanostructures Made Easy**" Advanced Materials. vol. 11. 1999. pp. 579-585.
Lee, Y-J., Braun, P.V., "Tunable Inverse Opal Hydrogel pH Sensors," Adv. Mater. 2003. 15. No. 7-8. Apr. 17, 2003. pp. 563-566.
Arsenault, A.C., et al., "A Polychromic, Fast Response Metallopolymer Gel Photonic Crystal with Solvent and Redox Tunability: A Step Towards Photonic Ink (P-Ink)," Adv. Mater. 2003, 15, No. 6, Mar. 17, 2003, pp. 503-507.
Zhang, S., et al., "Materials and techniques for electrochemical biosensor design and construction," Biosensors & Bioelectronics 15, (2000), pp. 273-282.
Wu, H., et al., "Reduction Photolithography Using Microlens Arrays: Applications in Gray Scale Photolithography," Analytical Chemistry, vol. 74, No. 14, Jul. 15, 2002, pp. 3267-3273.
Leister Microsystems, leaflet by Leister Microsystems entitled, "Micro-optics—Imagine the Future of Light." Sep. 2000. 4 pages.
Stokes, D.L., et al., "Detection of E. coli using a microfluidics-based Antibody Biochip detection systems," Fresenius, J. Anal Chem (2001) 369, pp. 295-301.
Jahns, J., et al., "Microoptics for biomedical applications," American Biotechnology Laboratory. No. 18. Oct. 2000. pp. 52 and 54.
Campbell, D.J., et al., "Replication and Compression of Bulk and Surface Structures with Pholydimethylsiloxane Elastomer," Journal of Chemical Education, vol. 75, No. 4, Apr. 1999, pp. 537-541.
Kruk, M., et al., "Mesoporous Silicate-Surfactant Composites with Hydrophobic Surfaces and Tailored Pore Sizes"; Journal of Physical Chemistry 106 B (2002) pp. 10096-10101.
Thrush, E., et al., "Integrated semiconductor fluorescent detection system for biochip and biomedical applications," IEEE-EMBS Special Topic Conference on Microtechnologies in Medicine & Biology, May 2002, pp. 374-378.
Avgeropoulos, et al., "Synthesis and Morphological Behavior of Silicon-ContainIng Triblock Copolymers for Nanostructure Applications," Chem. Mater. 1998, 10, pp. 2109-2115.
Chan, Vanessa A-H., et al., "Ordered Bicontinuous Nanoporous and Nanorelief Ceramic Films from Self-Assembling Polymer Precursors," Science, Nov. 26, 1999, vol. 286, pp. 1716-1719.
Shishido, A., et al., "Direct fabrication of two-dimensional titania arrays using Interference photolithography," Applied Phyiscal Letters, vol. 79, No. 20, Nov. 12, 2001, pp. 3332-3334.
Young, "Organic-Inorganic Monomers," accessed at http://www.psrc.usm.edu/mauritz/nano2.html. Jul. 8, 2002.
Yang, et al., "Creating Periodic Three-Dimensional Structures by Multibeam Interference of Visible Laser," Chemistry of Materials, vol. 14, No. 7, Jul. 2002, pp. 2831-2833.
Vlasov et al., "On-Chip Netural Assembly of Silicon Photonic Bandgap Crystals." Nature. vol. 414. Nov. 15, 2001. pp. 289-293.
Baney, et al., "Silsesquioxanes," American Chemical Society, 1995, pp. 1409-1430.
The Wittman Company, "Carbon Dioxide," published online at http://www.witteman.com/co2.htm. Dec. 4, 2002. 2 pages.
"Sol-Gel Chemistry," published online at http://www.sol-gel.com/chemi.htm, Dec. 9, 2002. 2 pages.
Abbot, N.L., et al., "Potential-Dependent Wetting of Aqueous Solutions on Self-Assembled Monolayers Formed from 15-(Ferrocenylcarbonyl) pentadecanethiol on Gold," Langmuir 1994, American Chemical Society vol. 10 pp. 1493-1497.
Abbot, N. L., et al. "Potential-Dependent Wetting of Aqubous Solutions on Self-Assembled Monolayers Formed from 15-(Ferrocenylcarbonyl) Pentadecaneithiol on Gold," Langmuir 1994, American Chemical Society vol. 10 pp. 1483-1487.
Kim, et al, "Nanostructured Surfaces for Dramatic Reduction of Flow Resistance in Dropllet-Based Microfluidics." IEEE. pp. 479-482 (2002).
E.W. Becker, et al., "Fabrication of microstructures with high aspect ratios and great structural heights by synchrotron radiation lithogra-

(56) References Cited

OTHER PUBLICATIONS phy, galvanoforming, and plastic moulding (LIGA process)", Microelectronic Engineering Elsevier Publishers RV Amsterdam NL vol. 4 No. 1 (May 1, 1986) pp. 35-56.

Surface Energy Material (dynes/cm), ACCUDYNETE, "Solid Surface Energies," accessed at http://www.accudynetest.com/surface_energy_materials.html, Jul. 27, 2005 (3 pages).

eFunda; General Information on Element Silicon, accessed at http://www.efunda.com/materials/elements/element_info.cfm?Element_ID=Si, Aug. 10, 2005 (8 pages).

Bhardwaj et al., "Advances in High Rate Silicon and Oxide Etching using ICP", STS Ltd., Imperial Park, Newport, UK NP10 89UJ (6 pags).

Templin, et el., "Organically Modified Aluminosilicate Mesostructrures from block Copolymer Phases", www.sciencemag.org, Science, vol. 278, Dec. 5, 1997, pp. 1795-1798.

Glod, et al., "An investigation of microscale explosive vaporization of water on an utrathin Pt wire", International Journal of Heat and Mass Transfer 45 (2002), pp. 367-379.

Four (4) European Search Reports each dated Sep. 15, 2004.

Aizenberg, et al., patent application for "A Low Adsorption Surface" filed Aug. 31, 2005.

Cawse, P.A., "The Determination of Nitrate in Soil Solutions by Ultraviolet Spectrophotometry", Analysit, May 1967, vol. 92, pp. 311-315.

Chang, K., "Nanograss' Turns Sticky to Slippery in an Instant", New York Times, Mar. 16, 2004.

Brenn, Gunter, "Concentration Fields in Drying Droplets," Chemical Engineering & Technology 27.12 (2004); pp. 1252-1258.

Cho, S.K., et al., "Creating, Transporting, Cutting and Merging Liquid Droplets by Electrowetting-Based Actuation for Digital Microfluidic Circuits", Journal of Microelectromechanical Systems, vol. 12, No. 1, Feb. 2003, pp. 70-80.

Welters, Wim JJ, and Lambertus Gj Fokkink. "Fast electrically switchable capillary effects." Langmuir 14.7 (1998): 1535-1538.

Verheijen, H. J. J., and M. W. J. Prins. "Contact angles and wetting velocity measured electrically." Review of scientific instruments 70.9 (1999): 3668-3673.

Mach, P., et al. "Dynamic tuning of optical waveguides with electrowetting pumps and recirculating fluid channels." Applied physics letters 81.2 (2002): 202-204.

\* cited by examiner

FLUID OSCILLATIONS ON STRUCTURED SURFACES

TECHNICAL FIELD OF THE INVENTION

The present invention is directed, in general, to a device and method for changing the vertical location of a fluid on a structured surface of the device.

BACKGROUND OF THE INVENTION

One problem encountered when handling small fluid volumes is to effectively mix different fluids together. Poor mixing can occur in channel-based microfluidic devices, where two or more volumes of different fluids, each flowing through microchannels, are combined together at a junction and into a single channel. In some cases, poor mixing can be ameliorated by introducing flow diverters into the junction or the single channel to redirect the flow of the two fluids to facilitate better mixing. However, flow diverters are complex structures that are technically difficult to construct. Additionally, channels having flow diverters are prone to being clogged by particles suspended in the fluid.

Poor mixing can also occur in droplet-based microfluidic devices, where the fluids are not confined in channels. Rather, small droplets of fluid (e.g., fluid volumes of about 100 microliters or less) are moved and mixed together on a surface. In some cases, it is desirable to add a small volume of a reagent to a sample droplet to facilitate the analysis of the sample, without substantially diluting it. In such cases, there is limited ability to mix two droplets together because there is no flow of fluids to facilitate mixing. Additionally, because there is no flow of fluids, it is not possible to facilitate mixing in droplets with the use of flow diverters.

Embodiments of the present invention overcome these problems by providing a device that facilitates the movement and mixing of small volumes of fluids, as well as providing methods of using and making such a device.

SUMMARY OF THE INVENTION

To address the above-discussed deficiencies, one embodiment of the present invention is a device. The device comprises a substrate having a surface that comprises a conductive base layer. The device also comprises fluid-support-structures on the conductive base layer. Each of the fluid-support-structures has at least one dimension of about 1 millimeter or less. Each of the fluid-support-structures is coated with an electrical insulator. The device is configured to oscillate a fluid locatable between tops of the fluid-support-structures and the conductive base layer when a voltage is applied between the conductive base layer and the fluid.

Another embodiment is a method of use. The method comprises placing a fluid on a substrate. The substrate has a conductive base layer and a plurality of the above-described fluid-support-structures on the conductive base layer. The method also comprises oscillating the fluid between tops of the fluid-support-structures and the conductive base layer by applying a voltage between the conductive base layer and the fluid.

Yet another embodiment comprises a method of manufacturing a device. The method comprises forming a first electrical insulating layer on a substrate. The method also comprises removing portions of the first electrical insulating layer and the substrate to form a conductive base layer and a plurality of the above-described fluid-support-structures. The method also comprises forming a second electrical insulating layer on sides of the fluid-support-structures. The conductive base layer is substantially devoid of the first and second electrical insulating layers.

BRIEF DESCRIPTION OF THE DRAWINGS

The invention is best understood from the following detailed description, when read with the accompanying figures. Various features may not be drawn to scale and may be arbitrarily increased or reduced for clarity of discussion. Reference is now made to the following descriptions taken in conjunction with the accompanying drawings, in which.

DETAILED DESCRIPTION

The present invention recognizes, for the first time, that the vertical position of a fluid can be made to oscillate on certain kinds of substrates having a conductive base layer and fluid-support-structures thereon. The application of a voltage between the fluid-support-structures and the fluid causes the fluid to move between tops of the fluid-support-structures and the conductive base layer, as the surface having the fluid-support-structures alternates between non-wetted and wetted states.

As part of the present invention, it was further discovered that oscillating fluids in this manner promotes the mixing of two fluids with each other. For instance, the oscillation of a fluid using the principles of the present invention can induce motion in a second fluid adjacent to the first fluid, thereby promoting mixing of the two fluids. Additionally, it was discovered that oscillating a fluid using the principles of the present invention can facilitate the lateral movement of the fluid over the fluid-support-structure.

Each fluid-support-structure can be a nanostructure or microstructure. The term nanostructure as used herein refers to a predefined raised feature on a surface that has at least one dimension that is about 1 micron or less. The term microstructure as used herein refers to a predefined raised feature on a surface that has at least one dimension that is about 1 millimeter or less. The term fluid as used herein refers to any gas or liquid that is locatable on the fluid-support-structure. The term non-wetted surface as used herein refers to a surface having fluid-support-structures that can support a droplet of fluid thereon such that the droplet has a contact angle of at least about 140 degrees. The term wetted surface as used herein refers to a surface having fluid-support-structures that can support a droplet of fluid thereon such that the droplet has a contact angle of about 90 degrees or less.

Figure 1:
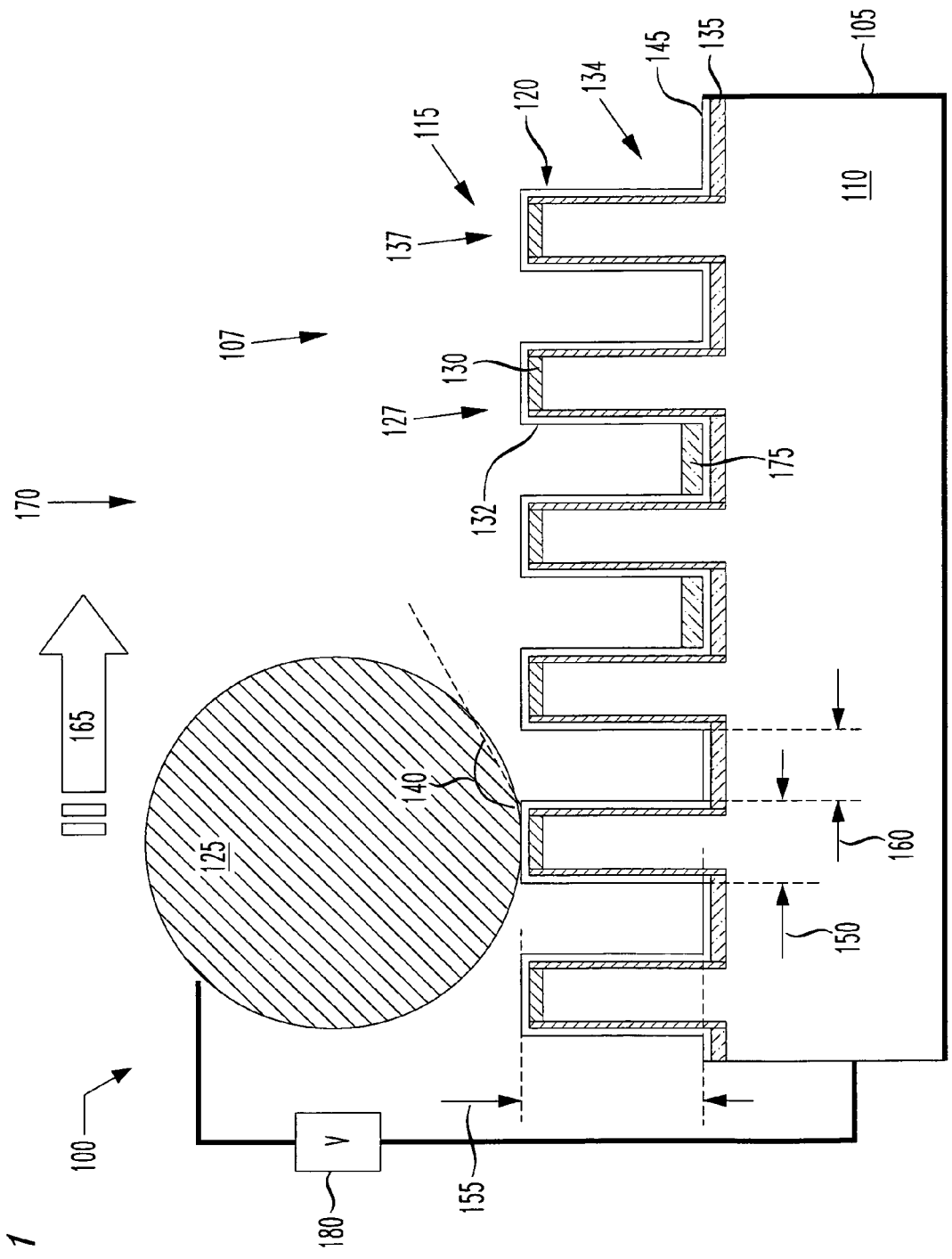
FIG. 1 presents a cross-sectional view of an exemplary device of the present invention.

One embodiment of the present invention is a device. Some preferred embodiments of the device comprise a mobile diagnostic device such as a lab-on-chip or microfluidic device. FIG. 1 presents a cross-sectional view of an exemplary device 100 of the present invention.

The device 100 comprises a substrate 105. The substrate 105 has a surface 107 that comprises a conductive base layer 110. The device 100 also includes fluid-support-structures 115 that are on the conductive base layer 110. Each of the fluid-support-structures 115 has at least one dimension of about 1 millimeter or less, and in some cases, about 1 micron or less. The surface 107 can have fluid-support-structures 115 that are microstructures or nanostructures, or both. The fluid-support-structures 115 are electrically coupled to the conductive base layer 110. Additionally, each fluid-support-structure 115 is coated with an electrical insulator 120. The device is configured to oscillate a fluid 125 locatable between tops 127 of the fluid-support-structures 115 and the conductive base layer 110, when a voltage (V) is applied between the conductive base layer 110 and the fluid 125.

As illustrated in FIG. 1 the fluid 125 can be a droplet, and, as further discussed below, embodiments of the device can be configured to move the droplet of fluid 125 vertically, such that the lower surface of the droplet moves back and forth between the tops 127 of the fluid-support-structures 115 to the conductive base layer 110 in a repetitive manner. The fluid 125 can start off on the tops 127 of the fluid-support-structures 115 or on the conductive base layer 110 when the oscillation is commenced by applying the voltage (V).

Although the fluid 125 is depicted in FIG. 1 as a droplet, it should be understood that other volumes of fluid are also within the scope of this, and other the embodiments discussed below. For example, the fluid 125 can be a volume in a microchannel having the above-described surface 107. Or, the fluid 125 can be a layer on the surface 107.

Certain preferred embodiments of the electrical insulator 120 comprise a first insulating layer 130 on the tops 127 of the fluid-support-structures 115 and a second insulating layer 132 on sides 134 of the fluid-support-structures 115. The first and second insulating layers 130, 132 can be composed of the same or different material. In some cases, such as when each of the fluid-support-structures 115 comprises silicon, the electrical insulator 120 can comprise one or more layers of silicon oxide. For example, the first and second insulating layers 130, 132 can both be composed of silicon oxide. As further discussed below, the silicon oxide comprising the first and second insulating layers 130, 132 can be deposited at different stages in the device's 100 fabrication process.

Some preferred embodiments of the conductive base layer 110 comprise silicon, metal silicide, or both. In some cases, the conductive base layer 110 comprises a conductive layer 135 located between individual ones of the sample-support-structures 115. A conductive base layer 110 that comprises an upper conductive layer 135 is preferred over a conductive base layer 110 made only of silicon, if the conductive layer 135 is more electrically conductive and more oxidation-resistant than silicon. In some preferred embodiments, for example, the conductive layer 135 comprises a metal silicide such as cobalt silicide. However, other metal silicides, such as tungsten silicide or nickel silicide, or alloys thereof, or other electrically conductive materials, such as metal films, can be used.

Preferably, the outer surface 137 of the conductive base layer 110 is not a wettable surface. That is, some preferred embodiments of the conductive base layer 110 can support a droplet of fluid thereon such that the droplet has a contact angle of at least about 140 degrees. A conductive base layer 110 with a wettable surface, that is, the droplet has a contact angle of about 90 degrees or less, can undesirably deter the fluid's 125 return to the tops 127 of the fluid-support-structures 115 after the fluid 125 contacts the conductive base layer 110, as further discussed below. In some cases, for example, the conductive base layer 110 comprises a material that can support a droplet of fluid 125 thereon such that the droplet has a contact angle 140 of at least about 100 degrees.

To facilitate the provision of a conductive base layer 110 whose outer surface 137 has the above-described contact angle 140, in some preferred embodiments, the conductive base layer 110 comprises a low-surface-energy layer 145. For the purposes of the present invention, a low-surface-energy layer refers to a material having a surface energy of about 22 dyne/cm (about $22 \times 10^{-5}$ N/cm) or less. Those of ordinary skill in the art would be familiar with the methods to measure the surface energy of material layers. In some preferred embodiments, the low-surface-energy layer 145 comprises a fluorinated polymer, such as polytetrafluoroethylene, and has a surface energy ranging from about 18 to about 20 dyne/cm.

In certain preferred embodiments, both the conductive base layer 110 and fluid-support-structures 115 comprise the low-surface-energy layer 145. Thus, the fluid-support-structures 115 can comprise an inner layer corresponding to the electrical insulator 120 and an outer layer corresponding to the low-surface-energy material 145. The conductive base layer 110 can comprise an inner layer corresponding to the conductive layer 135 (such as a metal silicide layer) and an outer layer corresponding to the low-surface-energy layer 145. In some cases, the fluid-support-structures 115 preferably are devoid of metal silicide, and the low-surface-energy layer 145 directly contacts the electrical insulator 120. Similarly, in some cases, the conductive base layer 110 preferably is devoid of the electrical insulator 120 and the low-surface-energy material 145 directly contacts the conductive layer 135.

In some instances, the sample-support-structures 115 are laterally separated from each other. For example, the sample-support-structures 115 depicted in FIG. 1 are post-shaped, and more specifically, cylindrically-shaped posts. The term post, as used herein, includes any structures having round, square, rectangular or other cross-sectional shapes.

Each of the fluid-support-structures 115 is a microstructure or nanostructure. When the fluid-support-structure 115 is a microstructure, it has at least one dimension of about 1 millimeter or less. When the fluid-support-structure 115 is a nanostructure, it has at least one dimension of about 1 micron or less. In some embodiments, the one dimension that is about 1 millimeter or less, or about 1 micron or less, corresponds to a lateral thickness 150 of the fluid-support-structure 115. The lateral thickness 150 corresponds to a diameter of the post when the post has a circular cross-section. In certain preferred embodiments, each of the sample-support-structures 115 has a uniform height 155. In some embodiments, the height 155 is in the range from about 1 to about 10 microns. In other embodiments, the lateral thickness 150 is about 1 micron or less, and the spacing 160 between the sample-support-structures 115 ranges from about 1 to about 10 microns. In some preferred embodiments, the lateral thickness 150 ranges from about 0.2 to about 0.4 microns.

In some embodiments of the device 100, the sample-support-structures 115 have a uniform spacing 160. However, in other cases, the spacing 160 is non-uniform. For instance, in some cases, it is desirable to progressively decrease the spacing 160 between sample-support-structures 115 along a direction 165 to a desired location 170 to facilitate the movement of the fluid 125 in that direction 165. For example, the spacing 160 can be progressively decreased from about 10 microns to about 1 micron.

As further illustrated in FIG. 1, the desired location 170 can comprise an analytical depot 175. The analytical depot 175 can comprise any conventional structure or material to facilitate the identification of, or to characterize, some property of the fluid 125. For example, the analytical depot 175 can comprise a reagent configured to interact with the fluid 125, thereby identifying a property of the fluid. As another example, the analytical depot 175 can comprise an organic field-effect transistor (OFET) configured to generate an electrical signal when it comes in contact with a particular type of DNA, protein or other material of interest dissolved or suspended in the fluid 125.

Some preferred embodiments of the device 100 also comprise an electrical source 180 configured to apply the voltage (V) between the conductive base layer 110 and the fluid 125 locatable on the fluid-support-structures 115. In some cases, the electrical source 180 is configured to apply a voltage ranging from about 1 to about 50 Volts. It is sometimes desirable for the voltage to be applied as a brief pulse so that the fluid 125 droplet after contacting the conductive base layer 110 can bounce back up to the tops 127 of the fluid-support-structures 115. In some cases, the applied voltage (V) is a series of voltage pulses applied at rate in the range from about 1 to 100 Hertz. In other cases, the applied voltage (V) is an AC voltage. In some preferred embodiments, the AC voltage (V) has a frequency in the range from about 1 to about 100 Hertz. In some cases, it is advantageous for the conductive base layer 110 to have a planar surface, because this facilitates the return of the fluid 127 to the tops 127 after bouncing off of the conductive base layer 110.

The application of the voltage (V) causes the fluid 125 to oscillate vertically, that is, make repeated transitions between tops 127 of the fluid-support-structures 115 and the conductive base layer 110. Some embodiments of the device 110 are configured to oscillate the fluid 125 at a frequency ranging from about 1 to about 100 Hertz, and more preferably from 10 to 30 Hertz. One cycle of fluid oscillation is defined to occur when the fluid makes a round-trip from the tops 127 of the fluid-support-structures 115, down to the conductive base layer 110 and back up to the tops 127. Consider, for example, an embodiment of the device 100 that comprises post-shaped fluid-support-structures 115 having a height 155 of about 10 microns, diameter 150 of about 300 nanometers, and spacing 160 of about 2 microns. An oscillation frequency of at least about 10 Hertz in such a device 100 can be obtained when about 20 to 30 Volts DC is applied between an aqueous fluid 125 and the fluid-support-structures 115.

In some cases, it is advantageous to use additional procedures to supplement the oscillation of the fluid as described above. For example, in some cases, the electrical source 180 is configured to pass a current through the conductive base layer 110, the fluid support-structures 115, or both, resulting in their heating. Preferably, the current is applied at least when the fluid 125 contacts the conductive base layer 110, but could be applied at other times as well. Heat from the conductive base layer 110 is thereby efficiently transferred to the fluid 125 when the fluid 125 contacts the conductive base layer 110. The heat imparted to the fluid 125 can increase the temperature of at least a portion of the fluid 125 to cause film boiling or a superheat explosion. In such instances, portions of the fluid 125 are converted to a vapor, which can force the remaining portion of the fluid 125 to the tops 127 of the fluid-support-structures 115. The movement of fluid using film boiling or superheat explosions is further discussed in U.S. patent application Ser. No. 11/227,808 entitled, "Heat-Induced Transitions on a Structured Surface," which is incorporated by reference in its entirety.

Figure 2:
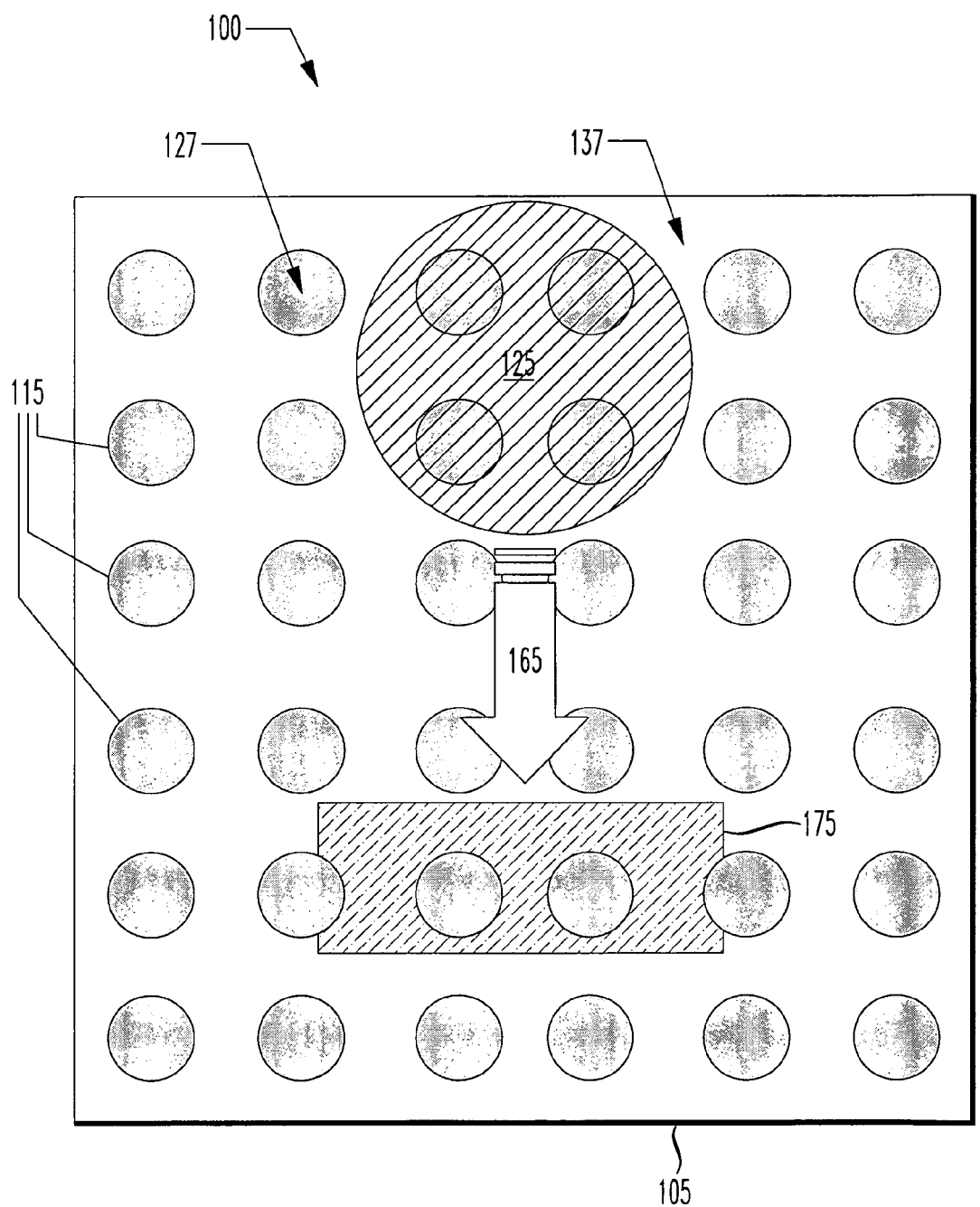
FIG. 2 shows a plan view the device presented in FIG. 1.
Figure 3:
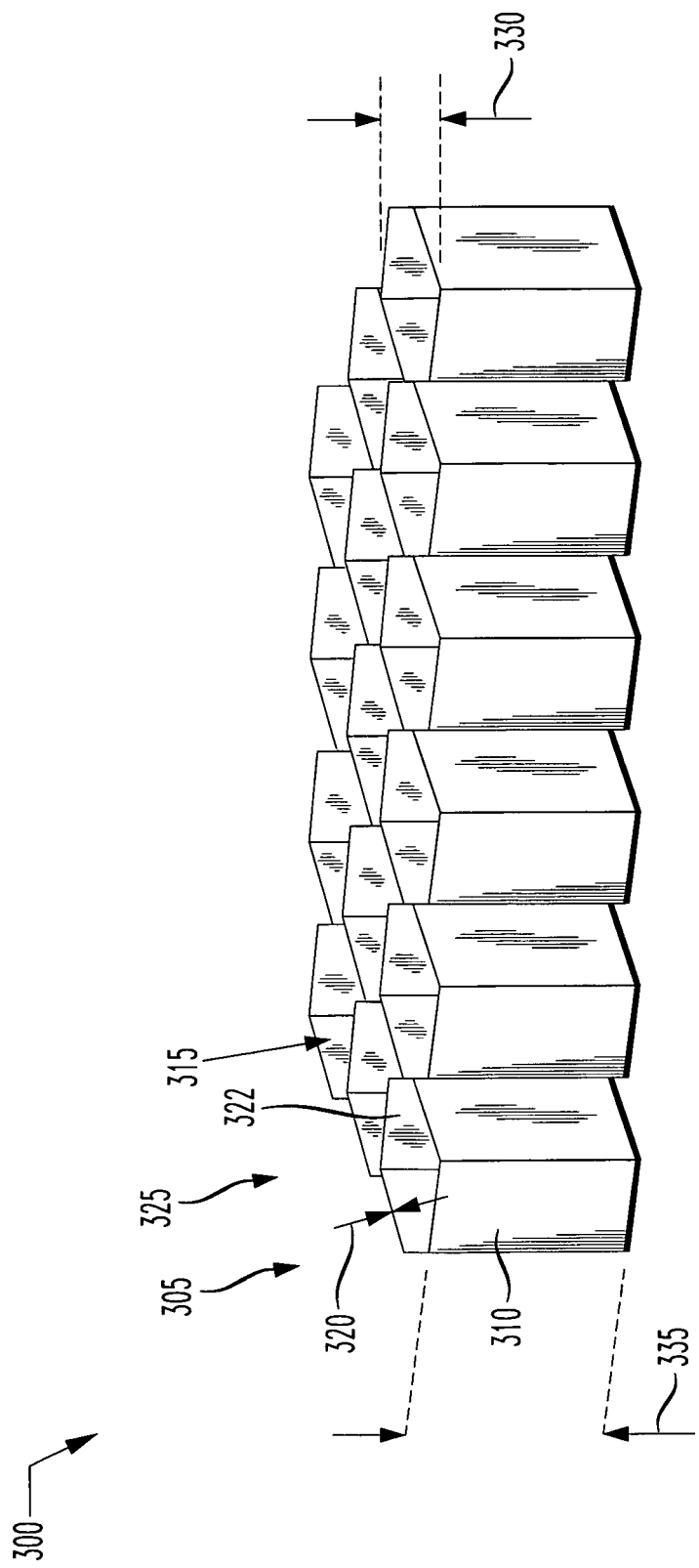
FIG. 3 presents a perspective view of sample-support-structures that comprises one or more cells.

In other cases, it is advantageous to arrange the laterally separated fluid-support-structures 115 into a two-dimensional array, such as illustrated in the plan view of the device 100 in FIG. 2. In other instances, the fluid-support-structures are laterally connected to each other. For example, FIG. 3 presents a perspective view of fluid-support-structures 300 that comprise one or more cells 305.

The term cell 305 as used herein refers to a structure having walls 310 that enclose an open area 315 on all sides except for the side over which the fluid could be disposed. In such embodiments, the one dimension that is about 1 micrometer or less is a lateral thickness 320 of walls 310 of the cell 305. As illustrated in FIG. 3, the fluid-support-structures 300 are laterally connected to each other because the cell 305 shares at least one wall 322 with an adjacent cell 325. In certain preferred embodiments, a maximum lateral width 330 of each cell 305 is about 15 microns or less and a maximum height 335 of each cell wall is about 50 microns or less. For the embodiment shown in FIG. 3, each cell 305 has an open area 315 prescribed by a hexagonal shape. However, in other embodiments of the cell 305, the open area 315 can be prescribed by circular, square, octagonal or other shapes.

Another aspect of the present invention is a method of use. FIGS. 4-7 present cross-section views of the exemplary device 100 shown in FIG. 1 at various stages of use. FIGS. 4-7 use the same reference numbers to depict analogous structures shown in FIGS. 1-2. However, any of the various embodiments of the devices of the present invention discussed above and illustrated in FIGS. 1-3 could be used in the method.

Figure 4:
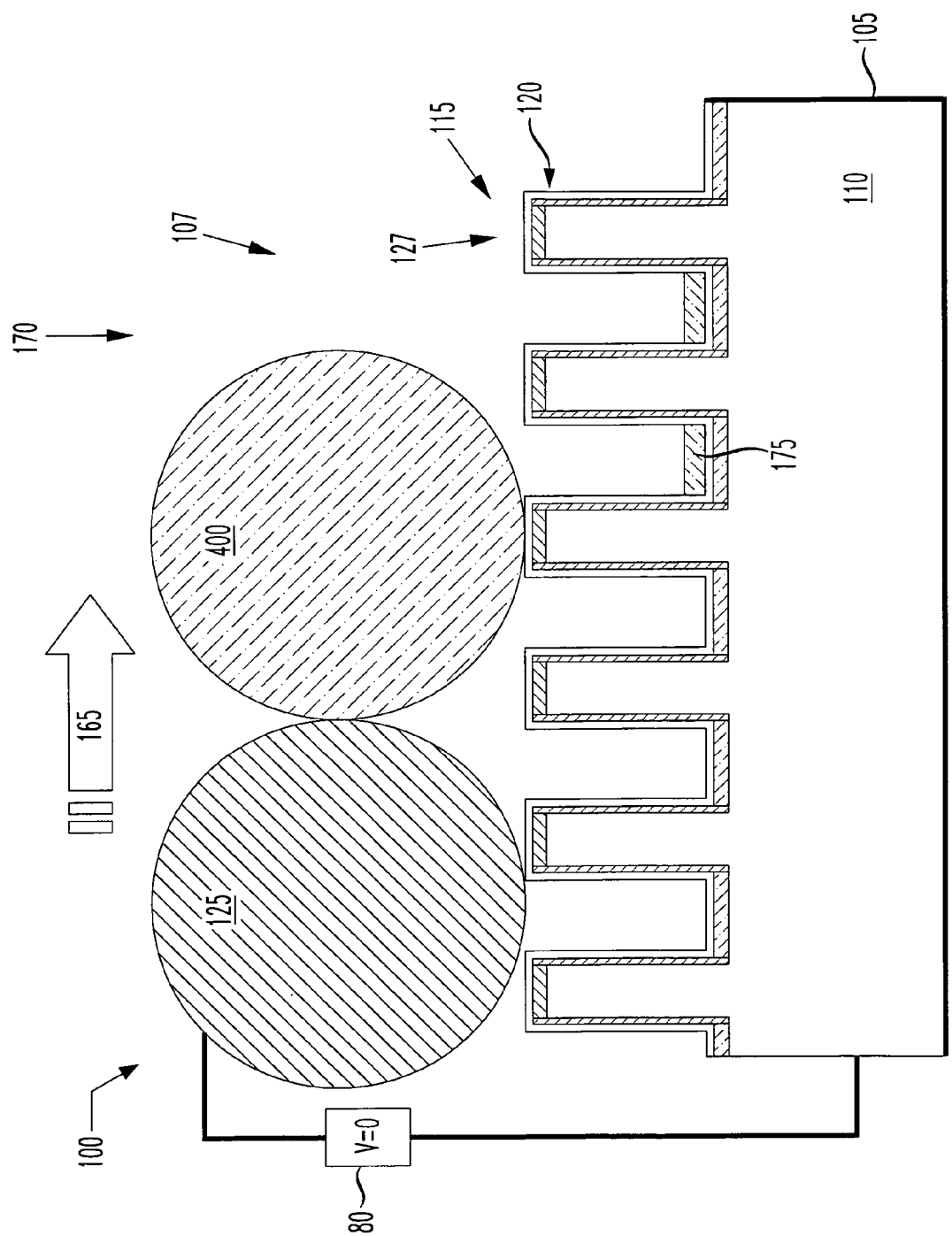
FIGS. 4-7 present cross-section views of an exemplary device at various stages of use.

Turning to FIG. 4, while maintaining reference to FIG. 1, illustrated is the device 100 after placing a fluid 125, such as a droplet, on a substrate 105. As with previously discussed device embodiments, the substrate 105 has a conductive base layer 110 and a plurality of fluid-support-structures 115 on the conductive base layer 110. Each of the fluid-support-structures 115 has at least one dimension of about 1 millimeter or less, and each of the fluid-support-structures 115 is coated with an electrical insulator 120. The fluid-support-structures 115, in the absence of an applied voltage, preferably provide a non-wettable surface 107 that supports the fluid 125 on the tops 127 of the fluid-support-structures 115. Preferably, the fluid 125 on the non-wettable surface 107 touches the uppermost 10 percent of the fluid-support-structures 115, and more preferably, only the tops 127 of the fluid-support-structures 115.

Figure 5:
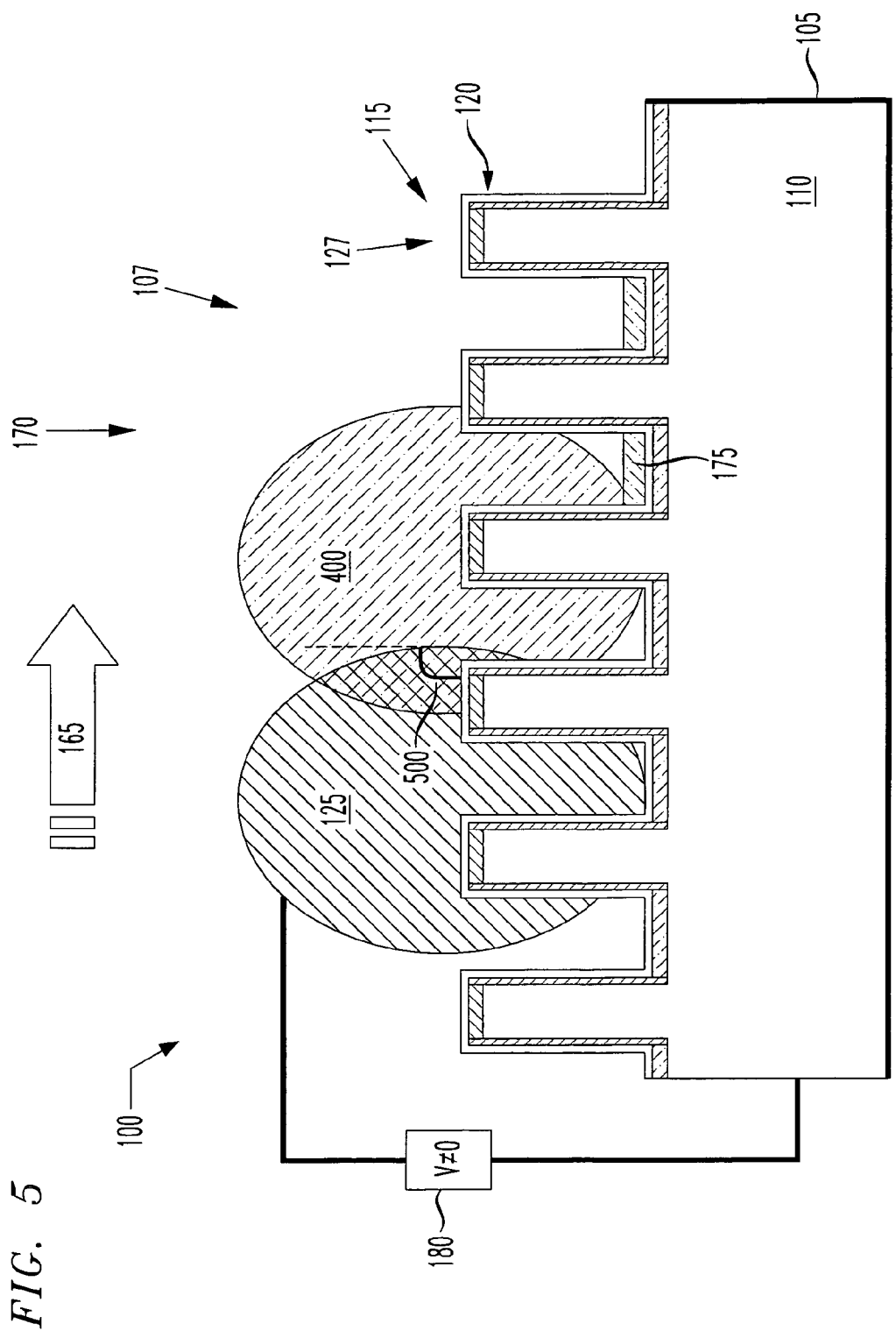
Figure 6:
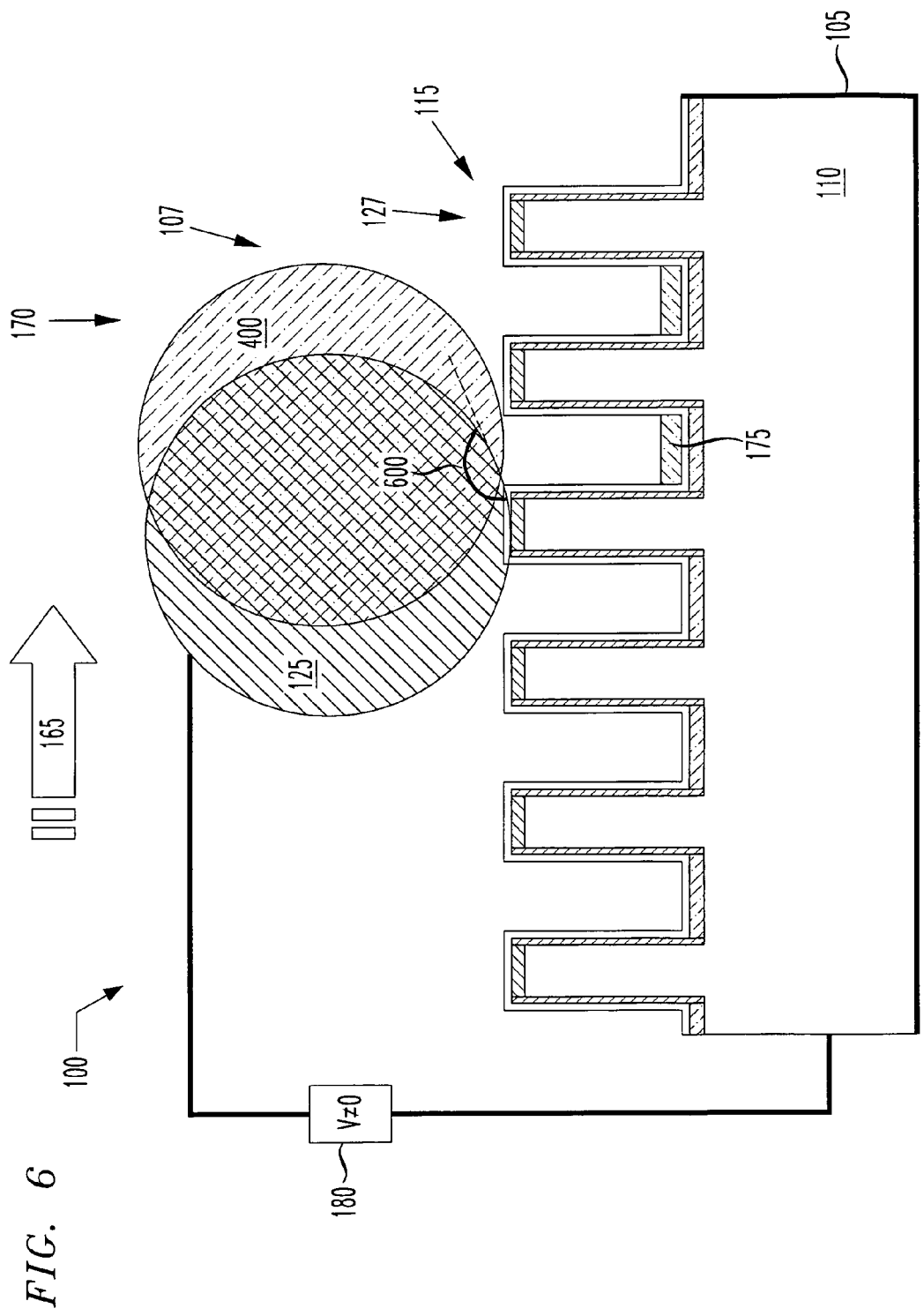

With continuing reference to FIG. 4, FIGS. 5 and 6 illustrate the device 100 while oscillating the fluid 125 between tops 127 of the fluid-support-structures 115 and the conductive base layer 110, by applying a non-zero voltage (V) between the conductive base layer 110 and the fluid 125. FIG. 5 shows the device 100 immediately after applying the voltage, whereupon the fluid-support-structures 115, and hence the substrate surface 107, become wetted. The wetted fluid-support-structures 115 can support a droplet of fluid 125 thereon such that the droplet has a contact angle 500 of about 90 degrees or less. Wetting allows the fluid 125 to penetrate between the fluid-support-structures 115, and to contact the conductive base layer 110. When the fluid 125 contacts the conductive base layer 110, the voltage potential between the fluid 125 and the conductive base layer 110 is nullified, that is, shorted-out by the conductivity of the fluid 125.

Consequently, as illustrated in FIG. 6, the surface 107 again becomes non-wetted, and the fluid 125 returns to the tops 127 of the fluid-support-structures 115. Preferred fluid-support-structures 115 are those that can support a droplet of fluid 125 thereon such that the droplet has a contact angle 600 of at least about 140 degrees. The vertical oscillation of the fluid between tops 127 of the fluid-support-structures 115 and the conductive base layer 110, such as illustrated in FIGS. 5-6, can be repeated any number of times, so long as the voltage (V) is applied.

Some preferred embodiments of the method include mixing two or more different fluids together. For example, as further illustrated in FIGS. 4-6, embodiments of the method can include placing a second fluid 400 adjacent the fluid 125, and oscillating the fluid 125 and the second fluid 400, thereby mixing the fluid 125 and second fluid 400 together. As illustrated in FIGS. 4-6, the fluid 125 and second fluid 400 can each be droplets on the surface 107 of the substrate 105.

In other cases, however, the fluid 125 is a layer on the substrate surface 107, and the second fluid 400 is a second layer on the layer of fluid 125. The latter may be the case, for example, when the fluid 125 has a higher density than the second fluid 400. In still other cases, the surface 107 comprises an interior surface of a channel, and the fluid 125 and second fluid 400 are inside the channel.

In yet other cases a small amount of a second, denser fluid 400 can be injected into a droplet of the fluid 125 already on the surface 107. In such instances, the injected fluid 400 can fall to the bottom of the fluid 125 and form a thin layer at the bottom of the droplet of fluid 125. In still other cases the second fluid 400 can have substantially the same (e.g., within about 10 percent) density as the fluid 125. When a small volume of such a fluid 400 is injected into the fluid 125, the second fluid 400 can float as a small sphere in the interior of the larger volume of fluid 125.

As also illustrated in FIGS. 5-6, preferred embodiments of the method include moving the fluid 125 laterally over the substrate surface 107 along a predefined direction 165. In still other embodiments, both the fluid 125 and the second fluid 400 are placed on the substrate surface 107, and then moved to a desired location 170 on the substrate. The movement to the desired location 170 can be accomplished while applying the voltage (V) to cause both the fluid 125 and the second fluid 400 to oscillate, thereby mixing the fluid 125 and second fluid 400 together while they are both being moved laterally.

Numerous methods can be used to facilitate the lateral movement of the fluid 125. In some cases, when the fluid 125 is in a channel whose interior surface comprises the above-described substrate surface 107, a pressure gradient can be applied to force the fluid 125, or fluids, through the channel. In other cases, movement is facilitated by progressively increasing the applied voltage (V) in a direction 165 towards the desired location 170. In other instances, movement is facilitated by progressively increasing a contact area between the tops 127 of the fluid-support-structures 115 and the fluid 125 in the direction 165 towards the desired location 170. The movement of fluid on structured surfaces is discussed in further detail in U.S. Patent Application 2004/0191127, which is incorporated by reference herein in its entirety.

Vertically oscillating the fluid 125 can facilitate the lateral movement of the fluid 125 over the substrate surface 107. Consider, for example, when a lateral potential difference is applied to move a droplet of fluid 125 in the desired direction 165. The movement of fluid 125 is impeded if the surface 107 becomes wetted and the fluid 125 penetrates between the fluid-support-structures 115. Moving the fluid 125 to the tops 127 of the fluid-support-structures 115 via the above-described process to oscillate the fluid 125, allows the fluid 125 to move laterally again.

Figure 7:
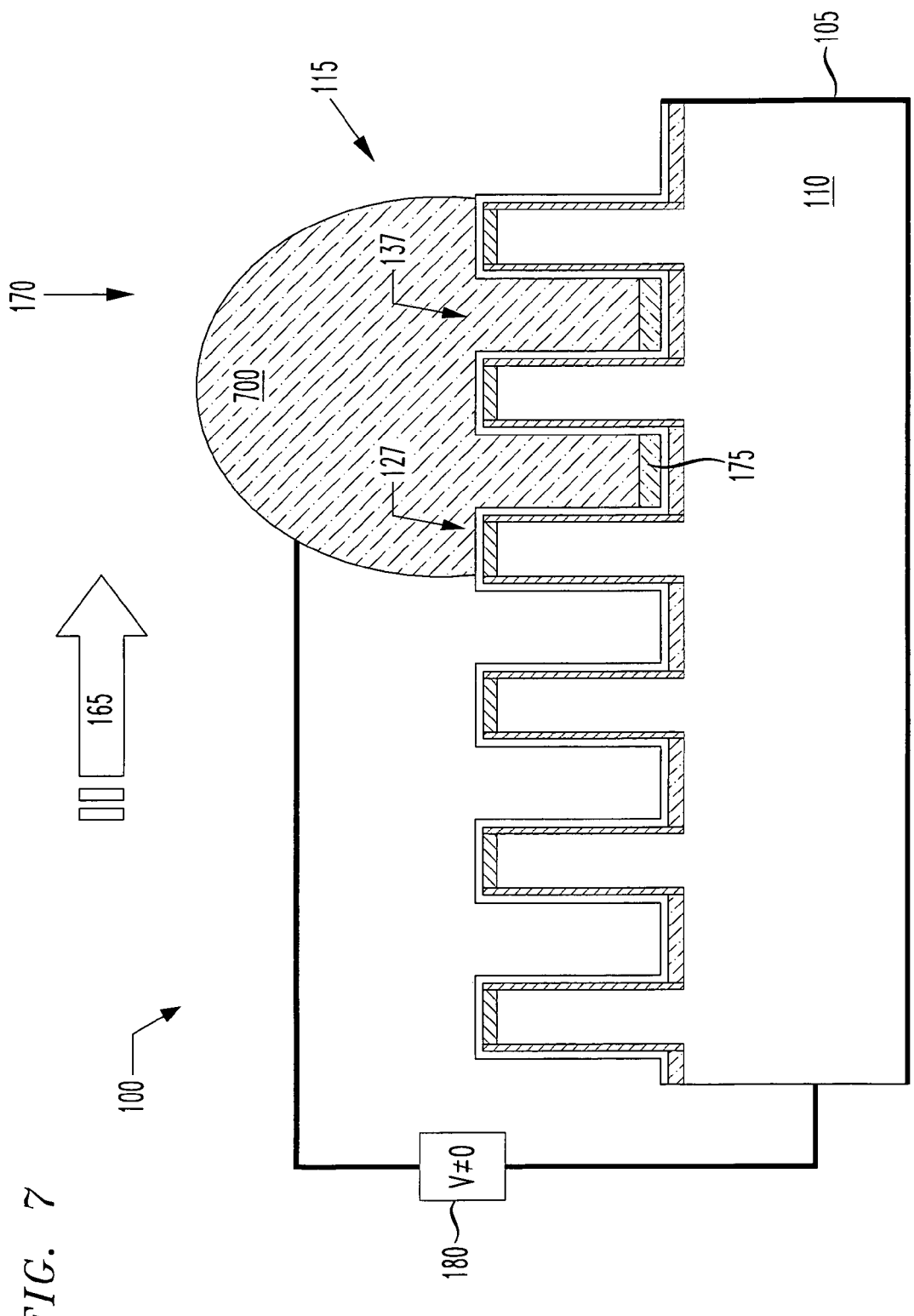

Turning now to FIG. 7, while maintaining reference to FIGS. 4-6, shown is the device 100 after moving the mixed fluid 700, corresponding to the mixture of the two fluids 125, 400, to the desired location 170. FIG. 7 depicts the mixture 700 while the substrate surface 107 is wetted by applying the voltage (V). When the surface 107 is wetted, the mixed fluid 700 is drawn to the analytical depot 175. After the mixed fluid 700 contacts the analytical depot 175, various conventional processes can be performed to analyze the mixed fluid 700, to determine one or both of the fluid's 125, 400 identity or properties.

It should be understood that the analytical depot 175 does not have to be located on the outer surface 137 of the conductive base layer 110, and the fluid 125 does not have to be moved down to the analytical depot 175, as depicted in FIG. 7. Rather, in alternative embodiments of the device 100, the second fluid 400 can be the analytical depot itself. For instance, the second fluid 400 can contain compounds configured to react with the fluid 125 or components in the fluid 125. The fluid 125 and the second fluid 400 can be mixed together by oscillating the fluids 125, 400 while they are being moved to a desired location 170. Alternatively, the fluid 125 and the second fluid 400 can be mixed together after they reach a desired location 170 from separate starting locations. In still other embodiments of the device 100, a fluid analytical depot 400 can be moved to a stationary fluid 125, and then mixed by oscillating the two fluids 125, 400.

Still another aspect of the present invention is a method of manufacturing a device. FIGS. 8-14 present cross-section views of an exemplary device 800 at selected stages of manufacture. The cross-sectional view of the exemplary device 100 is analogous to that presented in FIG. 1. The same reference numbers are used to depict analogous structures shown in FIGS. 1-7. Any of the above-described embodiments of devices can be manufactured by the method.

Figure 8:
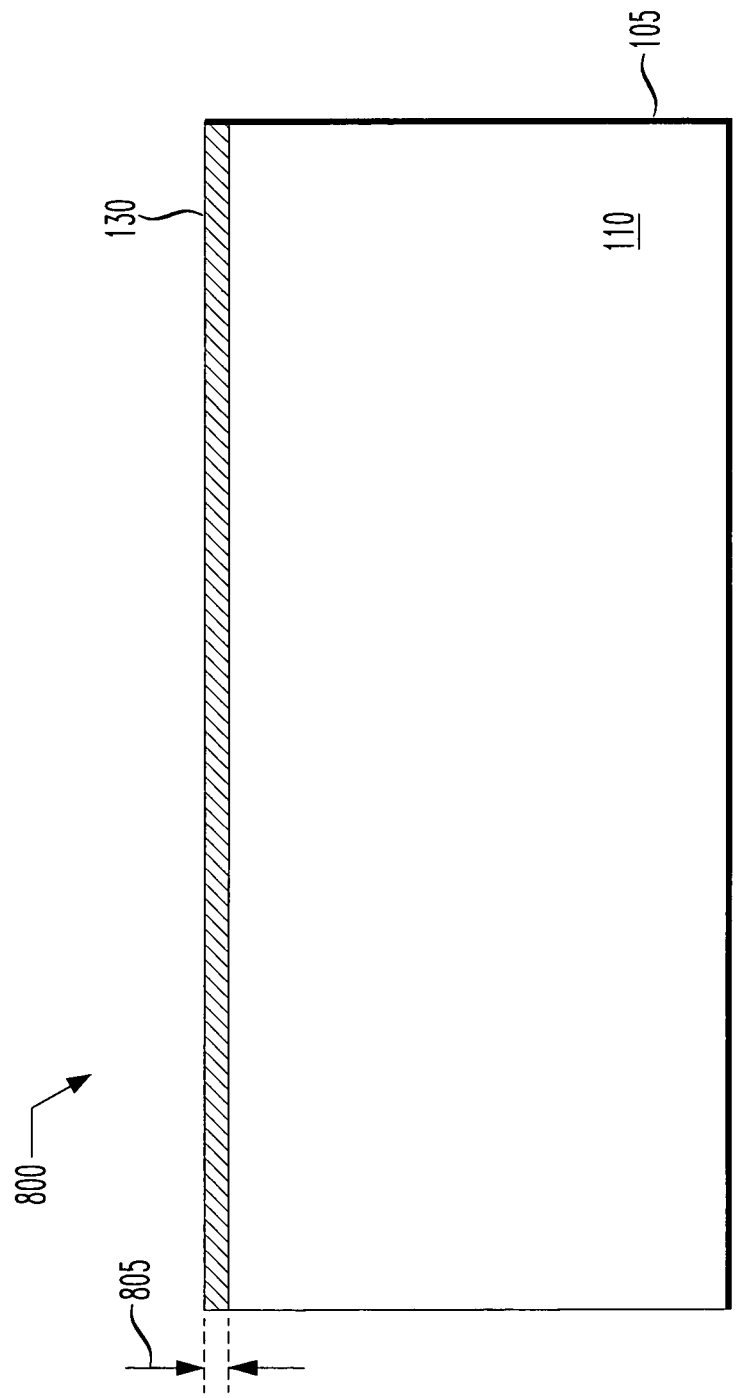
FIGS. 8-14 present cross-section views of an exemplary device at selected stages of manufacture.

Turning first to FIG. 8, with continuing reference to FIG. 1, shown is the partially-completed device 800 after forming a first electrical insulating layer 130 on a substrate 105. In some embodiments in which the substrate 105 comprises silicon, the first electrical insulating layer 130 is formed by conventional thermal oxidation. In some cases, thermal oxidation comprises heating a silicon substrate 105 to a temperature in the range from about 800 to about 1300° C. in the presence of an oxidizing atmosphere such as oxygen and water. In some cases, the first electrical insulating layer 130 has a thickness 805 of about 10 to about 100 microns. In other cases, the first electrical insulating layer 130 has a thickness 805 of about 10 to about 100 nanometers.

Figure 9:
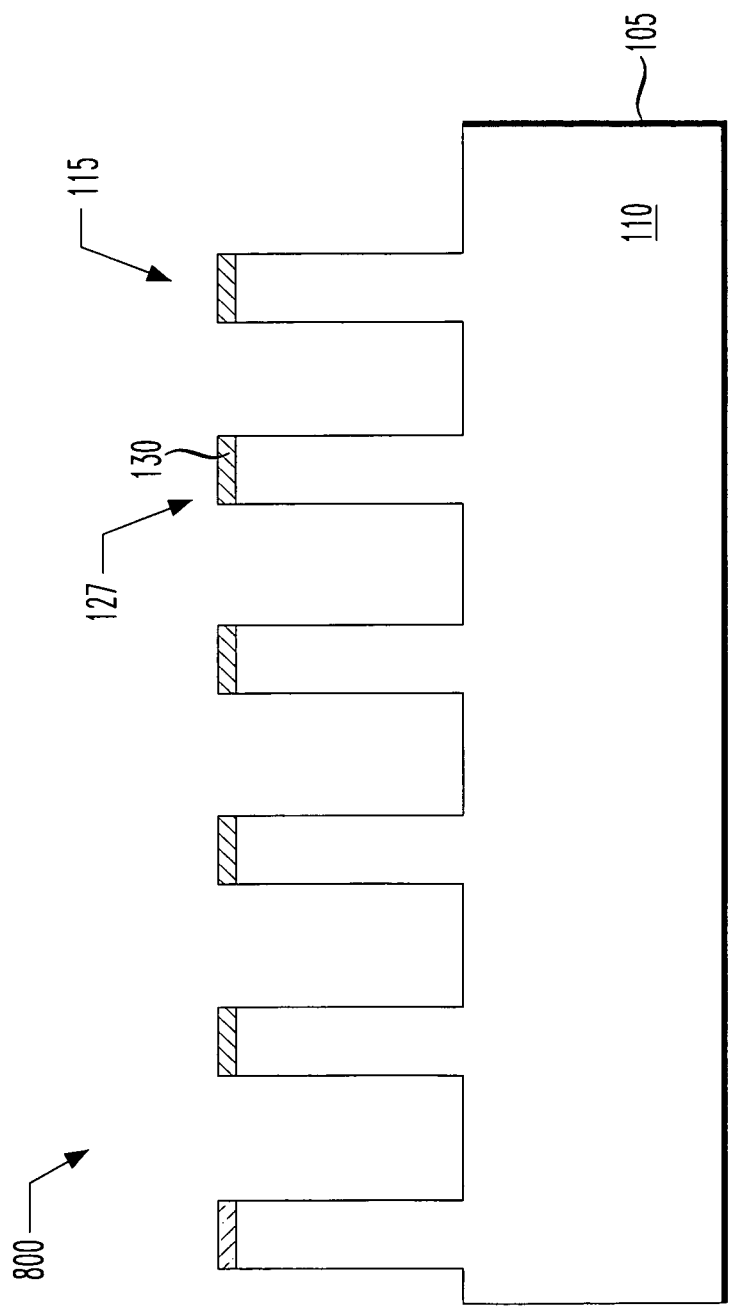
Figure 10:
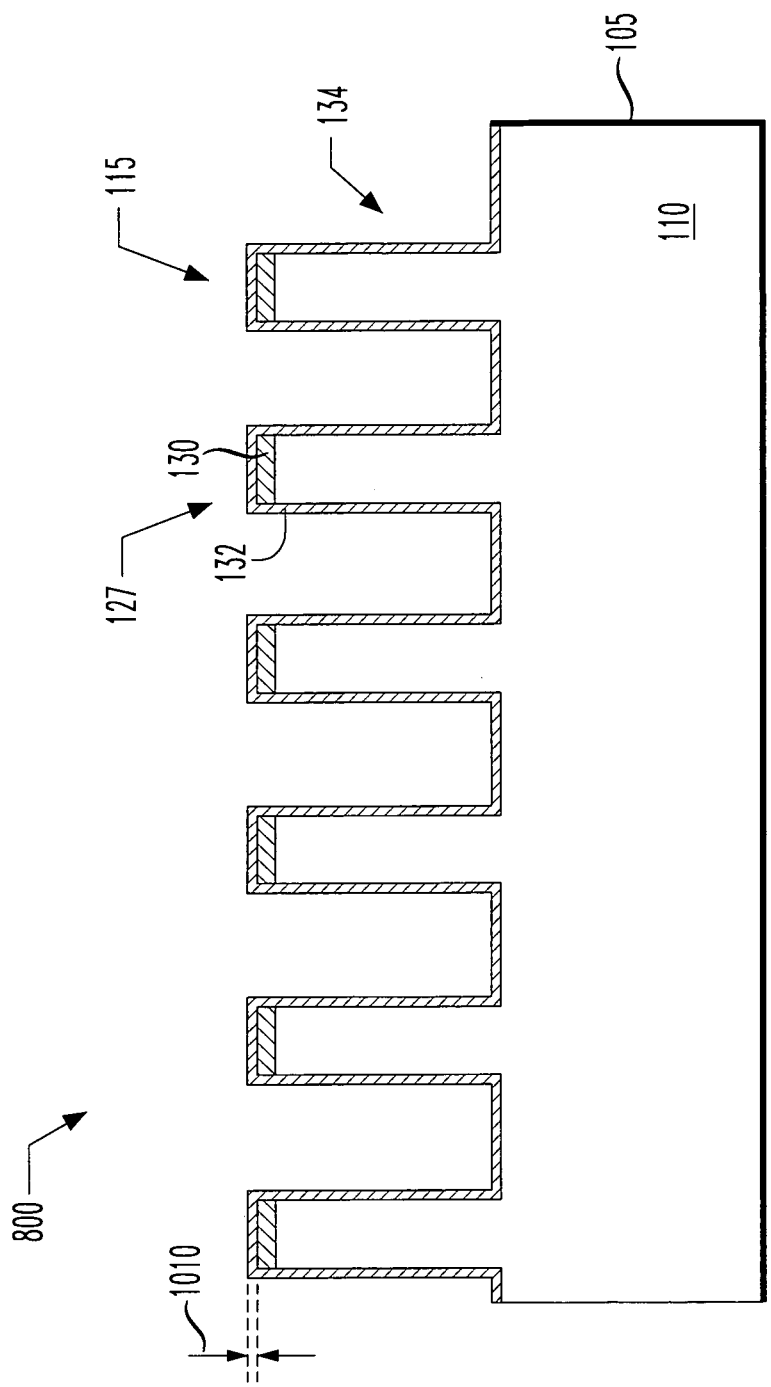

Referring to FIG. 9, while maintaining reference to FIGS. 1-8, illustrated is the partially-completed device 800 after removing portions of the first electrical insulating layer 130 and the substrate 105 to form a conductive base layer 110 and a plurality of fluid-support-structures 115. As discussed above, each of the completed fluid-support-structures 115 has at least one dimension of about 1 millimeter or less and comprises the first electrical insulating layer 130 thereon.

In some embodiments of the method, conventional photolithographic and wet or dry etching procedures, for example, deep reactive ion etching, are used alone or together to remove portions of the substrate 105 and first electrical insulating layer 130. Of course, in such instances, the conductive base layer 110 is substantially devoid of the first electrical insulating layer 130. However, the tops 127 of the fluid-support-structures 115 retain the first electrical insulating layer 130 thereon.

With continuing reference to FIGS. 1-9, FIG. 10 presents the partially-completed device 800 after forming a second electrical insulating layer 132 on sides 134 of the fluid-support-structures 115. The second electrical insulating layer 132 can be formed using similar methodology, and to the same or smaller thickness 1010 as used to form the first electrical insulating layer 130. In some embodiments of the method, forming the first and second electrical insulating layers 130, 132 comprises two separate thermal oxidation steps to grow two silicon oxide layers on fluid-support-structures 115 that comprise silicon. In such instances, both of the first and second electrical insulating layers 130, 132 are on the tops 127 of the fluid-support-structures 115. Additionally, the second electrical insulating layer 132 is on the conductive base layer 110. Having an insulator on the conductive base layer 110, however, is undesirable, because this impairs the ability of the conductive base layer 110 to conduct electricity.

Figure 11:
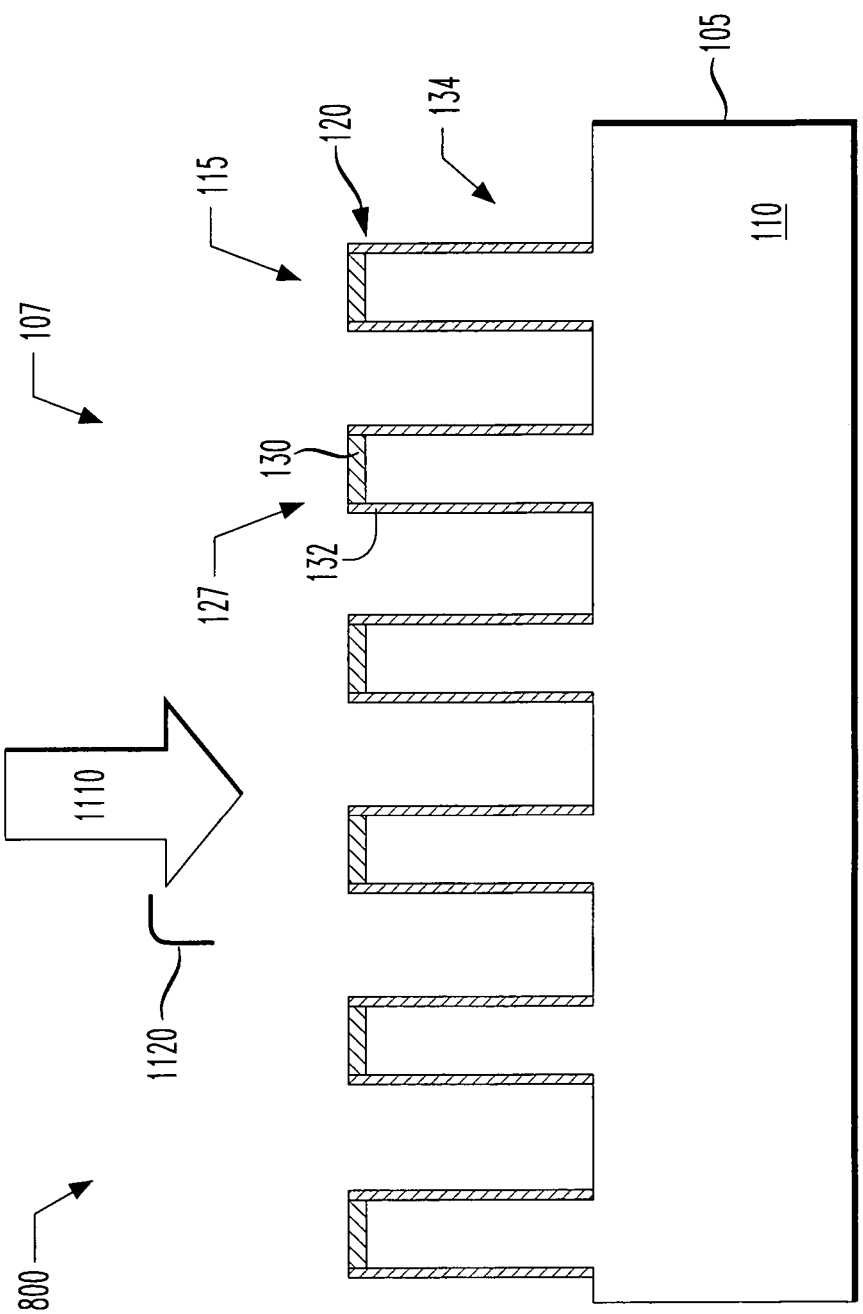

As illustrated in FIG. 11, with continuing reference to FIGS. 1-10, forming the second electrical insulating layer 132 on the sides 134 of the fluid-support-structures 115 further comprises removing the second electrical insulating layer 132 from the conductive base layer 110. The conductive base layer 110 is thereby made substantially devoid of the second electrical insulating layer 132. In some cases, the second electrical insulating layer 132 is removed from the conductive base layer via etching, and more preferably, perpendicular etching.

The perpendicular etch can comprise a reactive ion dry etch or plasma dry etch. Preferably, the particle beam 1110 used for etching is situated at an angle 1120 of about 90 degrees to the surface 107 of the substrate 105 on which the fluid-support-structures 115 are located. Any conventional etch for removing silicon oxide or other insulating material can be used, so long as the removal is greatest for the oxide material that is perpendicular to the beam 1110.

As further illustrated in FIG. 11, the etch can substantially remove the second electrical insulating layer 132 from the tops 127 of the fluid-support-structures 115. However, the extent of etching is carefully adjusted so that the first electrical insulating layer 130 remains on the tops 127. For instance, the etch can be continued for a period that is sufficient to remove all of the silicon oxide layer 132 from the conductive base layer 110, but not long enough to remove all of the silicon oxide layer 130 from the tops 127 of the fluid-support-structures 115. Additionally, the second electrical insulating layer 132 on the sides 134 of the fluid-support-structures 115 is left substantially unaltered by etching. Hence, the fluid-support-structures 115 are coated with one or both of the first and second insulating layers 130, 132, thereby completing the formation of the electrical insulator 120.

Figure 12:
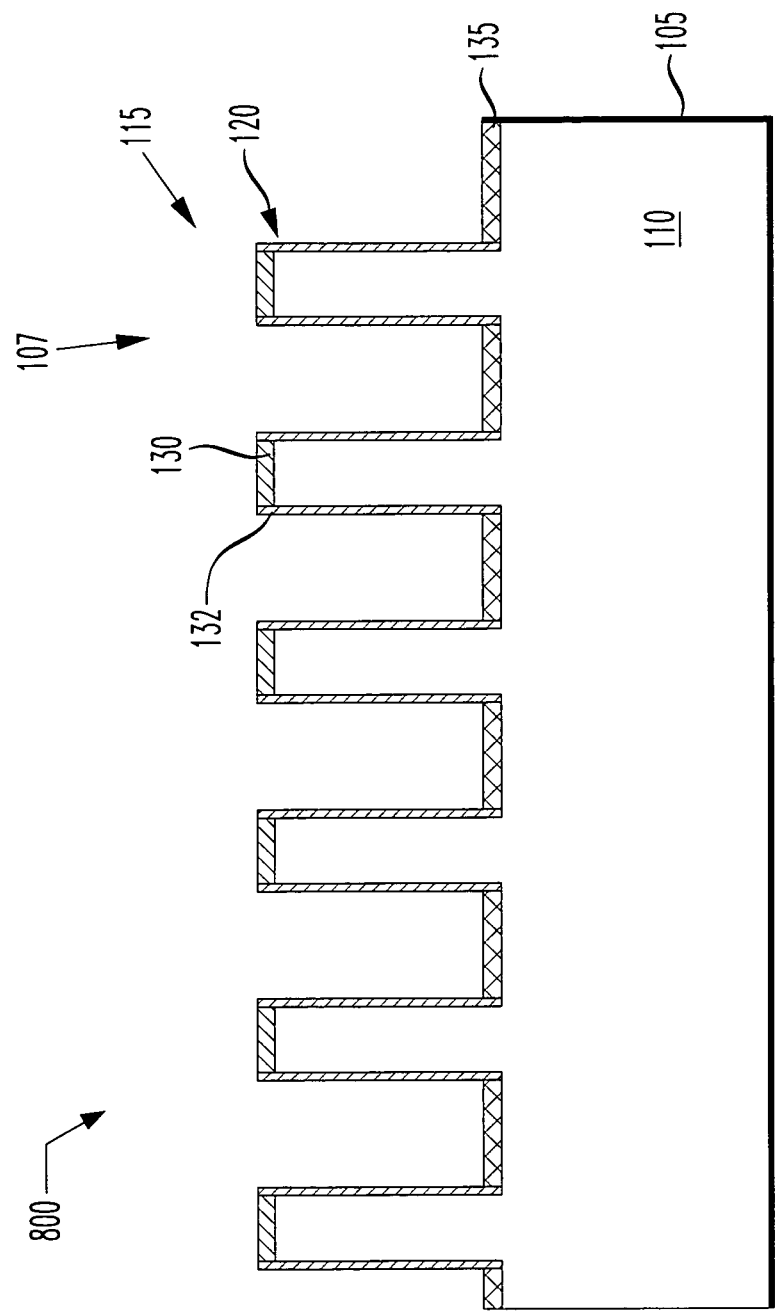

In some preferred embodiments of the method, such as illustrated in FIG. 12, while maintaining reference to FIGS. 1-11, forming the conductive base layer 110 further includes forming a conductive layer 135 such as a metal silicide layer. Any conventional procedure can be used to form the metal silicide layer 135. For example, a metal such as cobalt can be evaporated over the surface 107 of a silicon substrate 105. Then the substrate 105 can be subjected to a high temperature anneal for a period sufficient to form the metal silicide layer 135. The thermal anneal is preferably followed by a conventional acid etch to remove any metal that has not been reacted to form the metal silicide layer 135. Preferably, the fluid-support-structures 115 are covered with an electrical insulator 120, such as silicon oxide, that is not conducive to metal silicide formation thereon. Consequently, the fluid-support-structures 115 are substantially free of the metal silicide layer 135.

Figure 13:
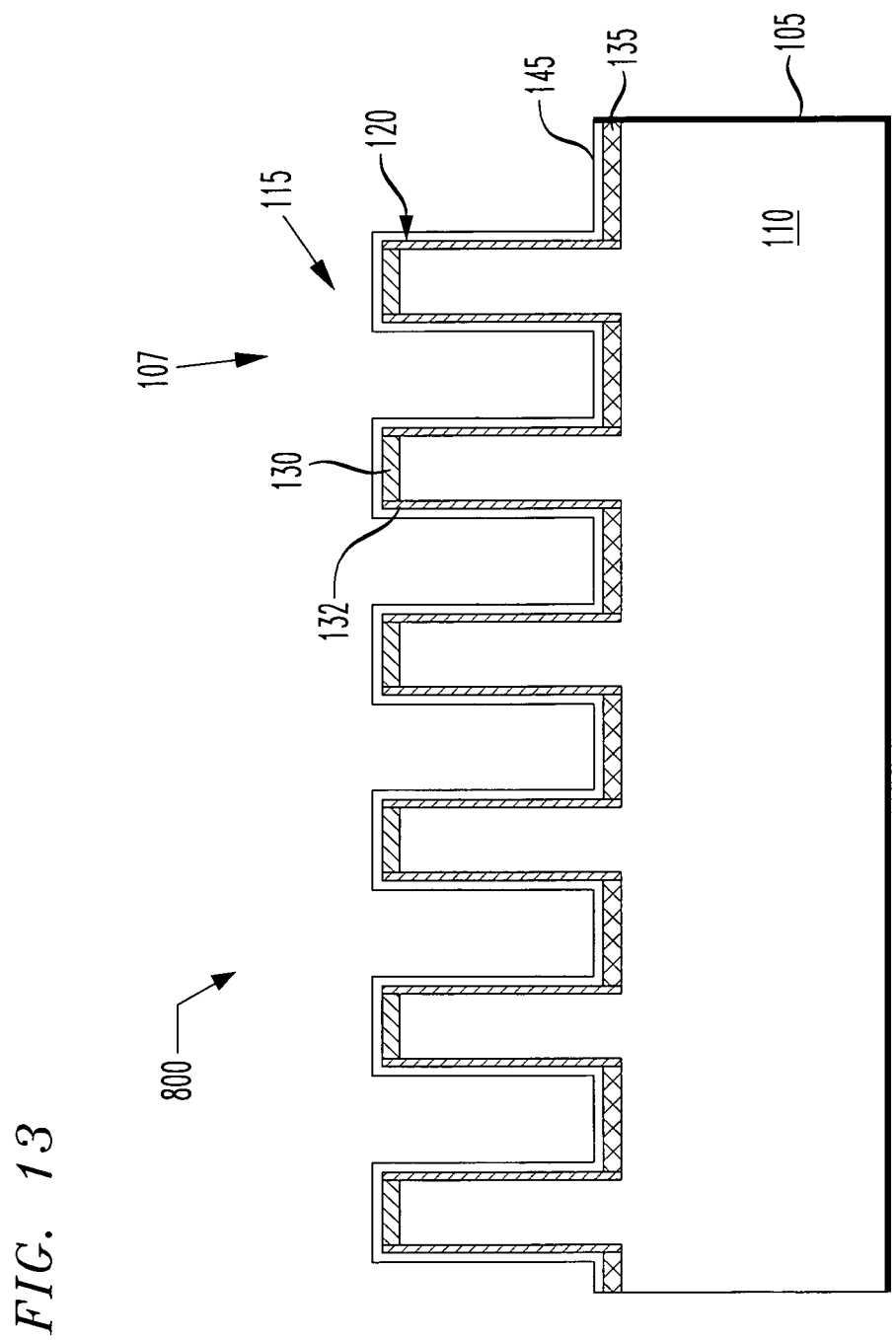

While still referring to FIGS. 1-12, some preferred embodiments of the method, such as illustrated in FIG. 13, also include coating the fluid-support-structures 115 and the conductive base layer 110 with a low-surface-energy layer 145. For example, a fluorinated polymer, such as polytetrafluoroethylene, can be spin coated over the surface 107 of the substrate 105.

Figure 14:
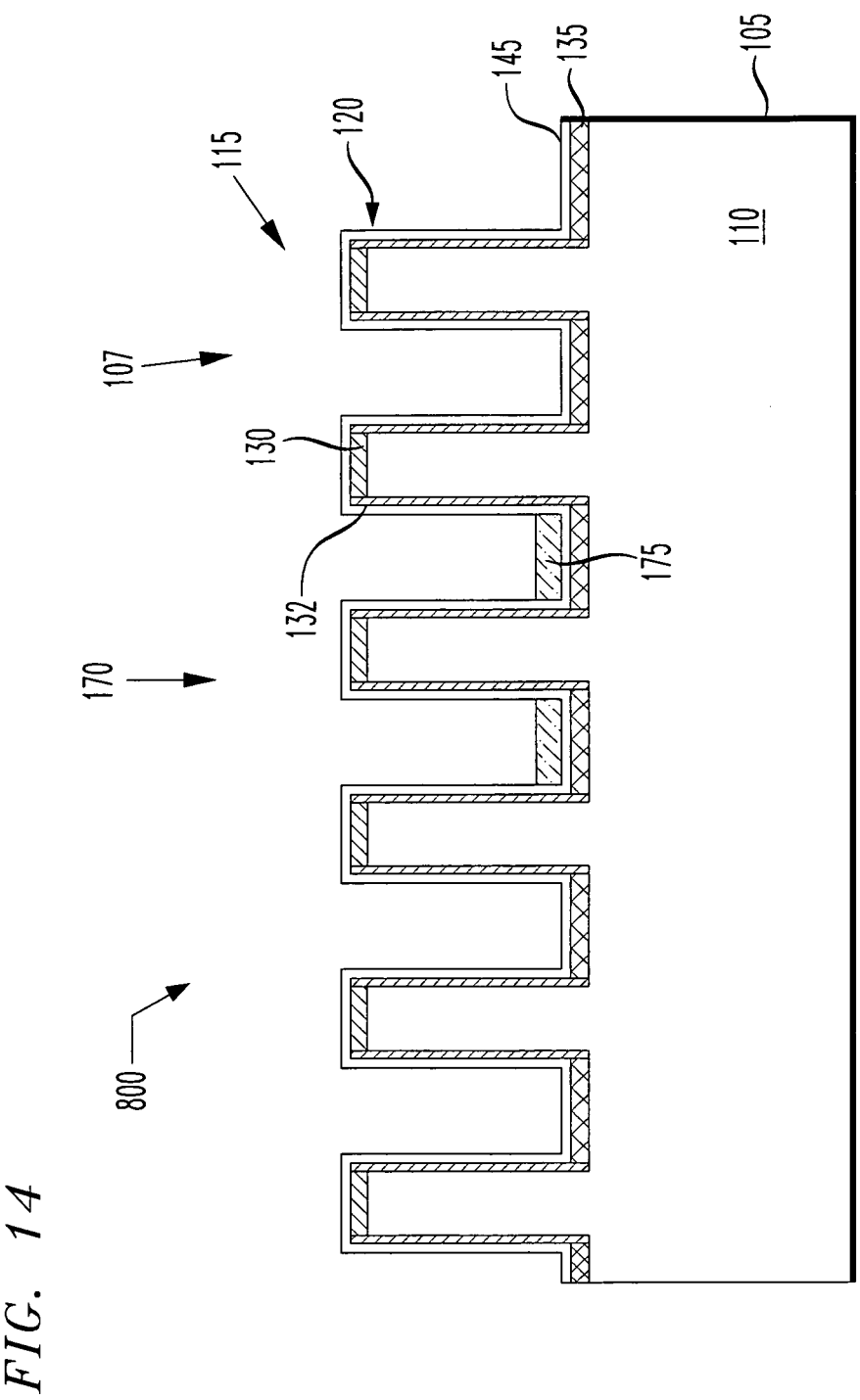

Turning now to FIG. 14, while maintaining reference to FIGS. 8-13, illustrated is the device 800 after forming an analytical depot 175 on the substrate 105. In some cases, the analytical depot 175 can be formed by depositing a fluid reagent on the fluid-support-structures 115 in the vicinity of the desired location 170. The surface 107 is then wetted, by applying a voltage between the conductive base layer 110 and fluid reagent, to bring the fluid reagent to the outer surface 137 of the conductive base layer 110. In other cases, the analytical depot 175 can be formed by constructing an organic field-effect transistor (OFET) at the desired location 170 in the substrate 105, using conventional procedures well known to those skilled in the art.

Although the present invention has been described in detail, those of ordinary skill in the art should understand that they could make various changes, substitutions and alterations herein without departing from the scope of the invention.

What is claimed is:

1. A device comprising:
   a substrate having a surface that comprises a conductive base layer; and
   fluid-support-structures on said conductive base layer, wherein each of said fluid-support-structures have at least one dimension of about 1 millimeter or less, each of said fluid-support-structures is coated with an electrical insulator and each of said fluid-support-structures comprises a cell and said at least one dimension is a lateral thickness of a wall of said cell; and
   an alternating voltage source configured to oscillate a fluid locatable between tops of said fluid-support-structures and said conductive base layer, wherein said alternating voltage source is connected to apply a voltage between said conductive base layer and said fluid.

2. The device of claim 1, wherein said electrical insulator comprises a first insulator on tops of said fluid-support-structures and a second insulator on sides of said fluid-support-structures.

3. The device of claim 1, wherein each of said fluid-support-structures comprise silicon and said electrical insulator comprises silicon oxide.

4. The device of claim 1, wherein said conductive base layer comprises a metal silicide.

5. The device of claim 1, wherein said sample-support-structures and said conductive base layer comprises a low-surface-energy layer.

6. The device of claim 1, wherein said conductive base layer has an inner layer comprising a conductive layer and an outer layer comprising a fluorinated polymer.

7. The device of claim 1, wherein each of said fluid-support-structures comprises a post and said one dimension is a lateral thickness of said post.

8. The device of claim 1, wherein said electrical source is configured to apply a series of voltage pulses between said conductive base layer and said fluid locatable on said fluid-support-structures, said voltage ranging from about 10 to about 50 volts.

9. The device of claim 1, wherein said device is configured to oscillate said fluid between tops of said fluid-support-structures and said conductive base layer at an oscillation frequency in the range of about 1 to about 100 Hertz.

* * * * *